United States Patent
Konishi et al.

(10) Patent No.: US 6,382,895 B1
(45) Date of Patent: May 7, 2002

(54) SUBSTRATE PROCESSING APPARATUS

(75) Inventors: Akio Konishi, Tokyo; Nobuyuki Takahashi, Kanagawa-ken, both of (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/450,710

(22) Filed: Nov. 30, 1999

(30) Foreign Application Priority Data

Dec. 28, 1998 (JP) ............................................ 10-374548

(51) Int. Cl.⁷ ................................................ B65G 49/07
(52) U.S. Cl. ...................................... 414/217; 414/939
(58) Field of Search .................................. 414/217, 939

(56) References Cited

U.S. PATENT DOCUMENTS

| | | | |
|---|---|---|---|
| 5,344,365 A | 9/1994 | Scott et al. | 454/187 |
| 5,515,986 A | 5/1996 | Turlot et al. | 216/71 |
| 5,944,857 A * | 8/1999 | Edwards et al. | 29/25.01 |
| 6,079,928 A * | 6/2000 | Theriault et al. | 414/217 |
| 6,176,667 B1 * | 1/2001 | Fairbairn et al. | 414/217 |
| 6,270,582 B1 * | 8/2001 | Riukin | 414/217 X |

FOREIGN PATENT DOCUMENTS

| | | |
|---|---|---|
| EP | 1 109 203 A2 | 6/2001 |
| JP | 59-010224 | 1/1984 |
| JP | 02-294018 | 12/1990 |
| JP | 05-152215 | 6/1993 |
| JP | 09-321120 | 12/1997 |
| JP | 10-55972 | 2/1998 |

OTHER PUBLICATIONS

Balzers Process Systems Catalog on KAI 10/20.

* cited by examiner

*Primary Examiner*—Steven A. Bratlie
(74) *Attorney, Agent, or Firm*—Burns, Doane, Swecker & Mathis, LLP

(57) ABSTRACT

Four load lock chambers 2, 2', 2", 2'" and eight process chambers 101, 102, 103, 104, 105, 106, 107 and 108 are hermetically connected around the outside of a central separation chamber 3 via gate valves 5—both types of chambers being stacked up in two places—and each chamber is capable of being evacuated by its respective vacuum pump system 301, 201 and 100. A transfer mechanism 42 inside separation chamber 3 removes a substrate 9 from a load lock chamber 2, 2', 2", 2'" transports it to each of the process chambers 101, 102, 103, 104, 105, 106, 107 and 108 in a prescribed sequence and thereafter returns it to load lock chamber 2, 2', 2", 2'". Each load lock chamber 2 has inside it a substrate holder which always holds a single substrate 9 in the same position.

19 Claims, 7 Drawing Sheets

SUBSTRATE PROCESSING APPARATUS

CROSS-REFERENCE TO RELATED APPLICATIONS

The present application corresponds to Japanese Patent Application No. H10-374548, filed Dec. 28, 1998, in Japan, the entire contents of which are hereby incorporated herein by reference.

BACKGROUND OF THE INVENTION

1. Field of the Invention

The present invention relates to a substrate processing devices that subjects a substrate to a prescribed process.

2. Description of Related Art

The surfaces of substrates are subjected to many prescribed processes in the production of electronic devices such as LSIs (large-scale integrated circuits) and display devices such as liquid crystal displays. For example, the production of an LSI involves film deposition processes to form various conducting films and insulating films on the surface of a substrate, and etching processes to form prescribed patterns in the substrate surface. The substrate processing apparatus that performs this sort of substrate processing can be broadly divided into batch processing apparatus that process a plurality of substrates all at the same time, and single substrate-processing apparatus that process substrates individually. A common type of batch processing apparatus is an oxidization apparatus that uses a furnace, but a single-substrate-processing apparatus is often used for film deposition and etching to achieve better uniformity and reproducibility of the processing on different wafers.

The simplest configuration of a single-wafer processing apparatus is a process chamber that performs a prescribed process. In this configuration, substrates are individually transferred into and processed in the process chamber, and are individually removed therefrom. However, a problem with such a configuration is that the interior of the process chamber is exposed to the outside atmosphere whenever a substrate is inserted or removed, thus impairing the processing quality. In particular, when the process chamber is a vacuum chamber that uses a vacuum, such as in a film deposition apparatus or an etching apparatus, opening the chamber to the atmosphere when inserting and removing a substrate makes it necessary to evacuate the process chamber every time a process is performed, leading to poor productivity. To avoid such problems, a load lock chamber is normally provided in which the substrate is left temporarily when it is inserted and removed, and this load lock chamber is hermetically connected to the process chamber. When the gate valve between the process chamber and load lock chamber is open, the gate valve on the atmospheric side of the load lock chamber is kept closed, so the process chamber is not directly exposed to the atmosphere in this configuration.

On the other hand, with the increasing functionality and complexity of manufactured products such as electronic devices, the processes to which substrates are subjected have also become more complex. Specifically, these products tend to be produced by performing many different processes on a substrate. In the abovementioned apparatus that uses a vacuum environment, it would be desirable to have the ability to perform different processes consecutively in vacuo. This is because if the next process is performed once the substrate has been re-exposed to the atmosphere, the atmospheric exposure can result in contamination of the substrate surface.

To meet this demand for consecutive in vacuo processing, multi-chamber type apparatus equipped with a plurality of process chambers have been developed. The first multi-chamber type apparatus to be developed was an in-line apparatus where a plurality of process chambers were arranged in a row. A transfer mechanism was used to transfer substrates in vacuo along the arrangement of the plurality of process chambers, thereby performing consecutive processing by transporting the substrates to each process chamber in turn. Separation chambers—which are fitted with a robot to transfer substrates—are often disposed between each process chamber to prevent cross-contamination of the atmospheres between each process chamber. In other words, the plurality of process chambers are arranged with separation chambers interspersed between them.

However, in the abovementioned in-line apparatus, the line gets longer every time the number of process chambers is increased to allow a greater number of processes to be performed. The number of intervening separation chambers also increases as the number of process chambers increases, and so there has been the disadvantage that the line gets progressively longer. As a result, there have been disadvantages in that the apparatus takes up a greater area and the configuration of the transfer mechanism gets more complex.

Cluster tool type apparatus has been developed to solve such drawbacks. A cluster tool type apparatus has a configuration whereby a plurality of load lock chambers and a plurality of process chambers are arranged around a single separation chamber. Cluster tool type substrate processing apparatus are currently in widespread use in single-substrate processing applications. FIG. 7 is an outline plan view of a cluster tool type substrate processing apparatus as one example of a conventional substrate processing apparatus.

The apparatus shown in FIG. 7 consists of a centrally provided separation chamber 8, with a plurality of process chambers 1 and load lock chambers 2 disposed around separation chamber 8. Each of the chambers 1, 2 and 8 is equipped with a dedicated or shared evacuation system, and is thereby pumped down to the prescribed pressure. Also, a gate valve 5 is provided at the connection positions of each chamber 1, 2 and 8. A transfer mechanism 42 is provided inside separation chamber 8 as a transfer mechanism to transfer substrate 9 in vacuo.

A processed substrate 9 is accommodated in load lock chamber 2 by an auto loader (not illustrated). A substrate 9 inside load lock chamber 2 is sequentially transferred into process chamber 1 by transfer mechanism 42 provided inside separation chamber 8, and is subjected to the prescribed processing. When the prescribed series of processes on substrate 9 has been completed, substrate 9 is put back in load lock chamber 2 by transfer mechanism 42. After that, it is taken out to the atmosphere by the auto loader (not illustrated).

In the abovementioned cluster tool type substrate processing apparatus, the plurality of process chambers is not disposed in a linear fashion, but is disposed in a ring around a single separation chamber. Consequently, it has advantages in that it is possible to reduce the area it takes up compared with an in-line type of apparatus, and in that the configuration of the transfer mechanism is not complex.

However, recent further increases in the complexity and speed of substrate processing and the increasing size of substrates have meant that even the cluster tool type apparatus described above is starting to reach the limits of its capabilities. Specifically, now that the processes performed on substrates are becoming even faster and more complex due to the demand for devices with greater integration density, increased functionality and lower cost, it is becoming necessary to equip the apparatus with even more process chambers. There are two main reasons why the number of process chambers must be further increased. One is that the number of processes to be performed on substrates is continuing to increase, as mentioned above. The other is to divide the same process between a plurality of chambers in order to increase throughput.

If one tries to increase the number of process chambers in the layout shown in FIG. 7, the perimeter of the separation chamber has to be increased. That is, the cross-sectional area of the separation chamber has to be increased. As the separation chamber gets larger, the apparatus takes up a correspondingly larger area. Also, as the chamber increases in size, the vacuum pump system that evacuates it must also be made more large scale. But the separation chamber itself is essentially wasted space as far as the substrate processing is concerned, so that the cost of the apparatus is needlessly increased by increasing the area taken up by this space and by increasing the scale of the vacuum pump system.

Also, as the cross-sectional area of the separation chamber increases, it becomes necessary to increase the size of the transfer robot's hand in the transfer mechanism, and its stroke length and transfer distance also increase. As a result, there is a problem in that the transfer mechanism also becomes more large-scale.

Furthermore, an apparatus of this sort is normally used by disposing it in a clean room whose interior cleanliness is kept at a prescribed level. As the area taken up by the apparatus increases, the clean room must be made correspondingly larger. A larger clean room requires more effort to keep the interior cleanliness at a prescribed level, leading to increased costs. It is therefore advantageous to make the constituent chambers of the apparatus as small as possible.

Another way of increasing the number of processes and increasing throughput is to increase the number of substrate processing apparatus. Specifically, this could be achieved by providing two sets of the apparatus shown in FIG. 7, with similar or different processes performed in each process chamber. However, this approach suffers from the problem that a substrate is exposed to the atmosphere when it is transferred from one apparatus to the next. And, although it is necessary only to increase the number of process chambers, this approach also increases the number of transfer mechanisms, load lock chambers and the like, and thus involves a considerable amount of unnecessary investment. There is also a problem in that two sets of apparatus take up twice as much area, thereby increasing the costs associated with maintaining the abovementioned degree of cleanliness.

One method of solving the aforementioned problems has been disclosed in JP10-55972, which claims the priority of U.S. patent application No. 08/644,636 now U.S. Pat. No. 6,176,667. In this disclosed system, a large load lock chamber 15 is disclosed which is connected to a transfer chamber 30 by doors 18, 19. A plurality of processing chambers $A_1$, $A_2$ are also connected to the transfer chamber 30 by doors 22. To save space, the processing chambers $A_1$, $A_2$ are arranged in a stacked, vertical configuration. One drawback of this disclosed system is that the load lock chamber 15 is designed large enough to accommodate a wafer cassette 12 that supports up to 100 wafers. Accordingly, each time the load lock chamber 15 is opened to the atmosphere to replace the wafer cassette 12, it takes a long time to again reduce the pressure in the load lock chamber 15 to a level that is sufficiently close to the processing pressures in the processing chambers $A_1$, $A_2$. Alternatively, a large-scale pump must be used.

As an alternate embodiment, JP10-55972 discloses the use of a group of smaller load lock chambers 61, 62, 63 in FIG. 4. Even the smaller load lock chambers 61, 62, 63 are designed to hold at least two wafers.

In both embodiments of JP10-55972, it is possible to have contamination (such as dust particle contamination) between the plurality of wafers loaded in one of the load lock chambers 15, 61, 62, 63. It is also possible to have contamination between one or more of the load lock chambers 15, 61, 62, 63 and the transfer chamber 30.

OBJECTS AND SUMMARY

The invention of the present application has been made in order to solve problems such as those described in the preceding section, and aims to provide a practical substrate processing apparatus that does not take up a greater area as the number of chambers is increased.

To solve the abovementioned problems according to the present invention, a substrate processing apparatus comprises a centrally provided evacuable separation chamber, a plurality of individually evacuable load lock chambers and a plurality of evacuable process chambers which are hermetically connected to the sides of the separation chamber via gate valves, and a transfer mechanism provided inside the separation chamber. The transfer mechanism removes a substrate from one of the load lock chambers, transfers it to the process chambers in a prescribed sequence, and then returns it to a load lock chamber. The load lock chambers are designed to hold only a single substrate.

A plurality of said load lock chambers and/or said process chambers are provided and are stacked up in at least one place around the periphery of said separation chamber. Each of the load lock chambers incorporates a substrate holder that holds just a single substrate.

According to another aspect of the present invention, the substrate processing apparatus is configured so that said substrate holder has a shape that facilitates the alignment of substrates whereby they are always held at the same position.

DETAILED DESCRIPTION OF THE PREFERRED EMBODIMENTS

Figure 1:
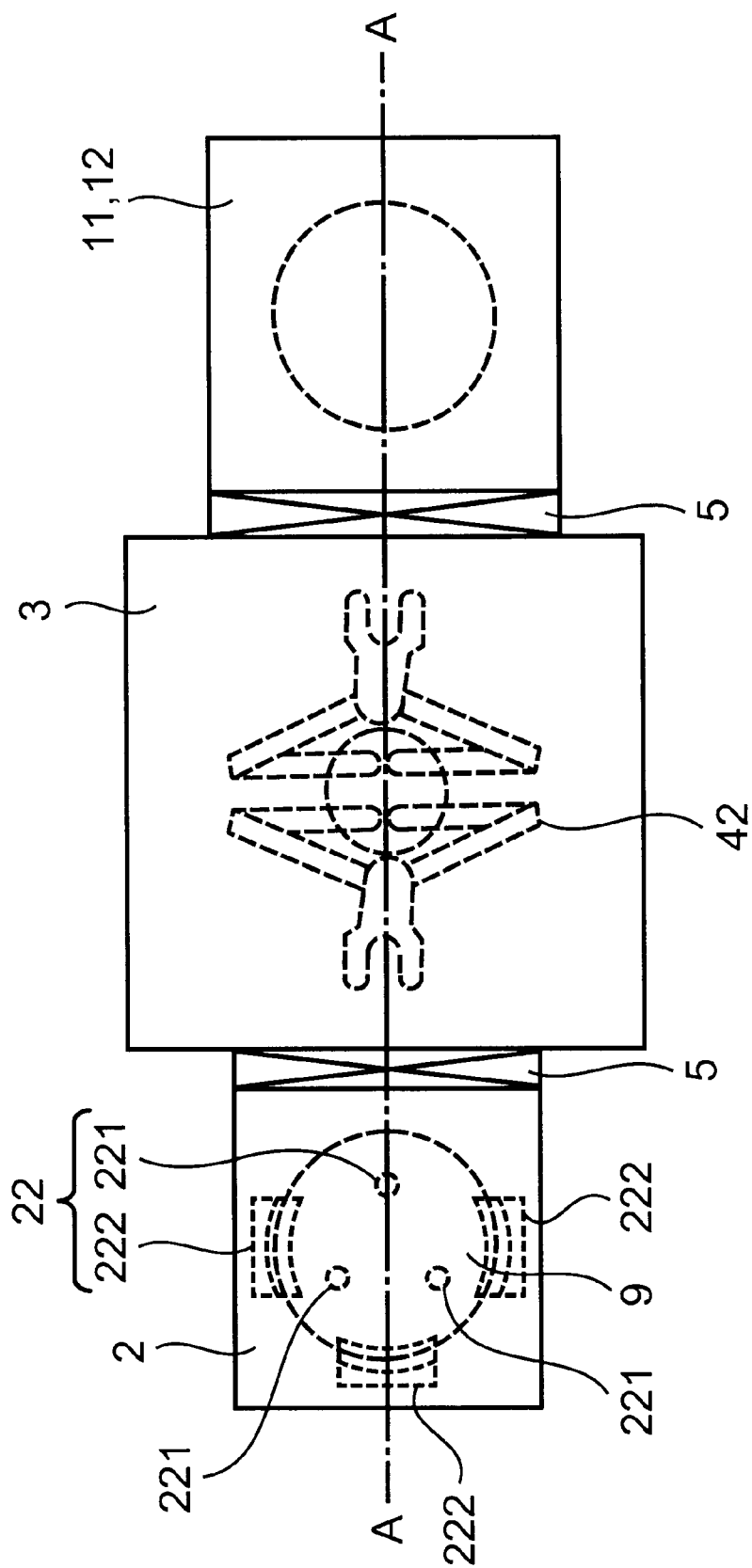
FIG. 1 is a plan view of a substrate processing apparatus according to a first embodiment of the invention of the present application.
Figure 2:
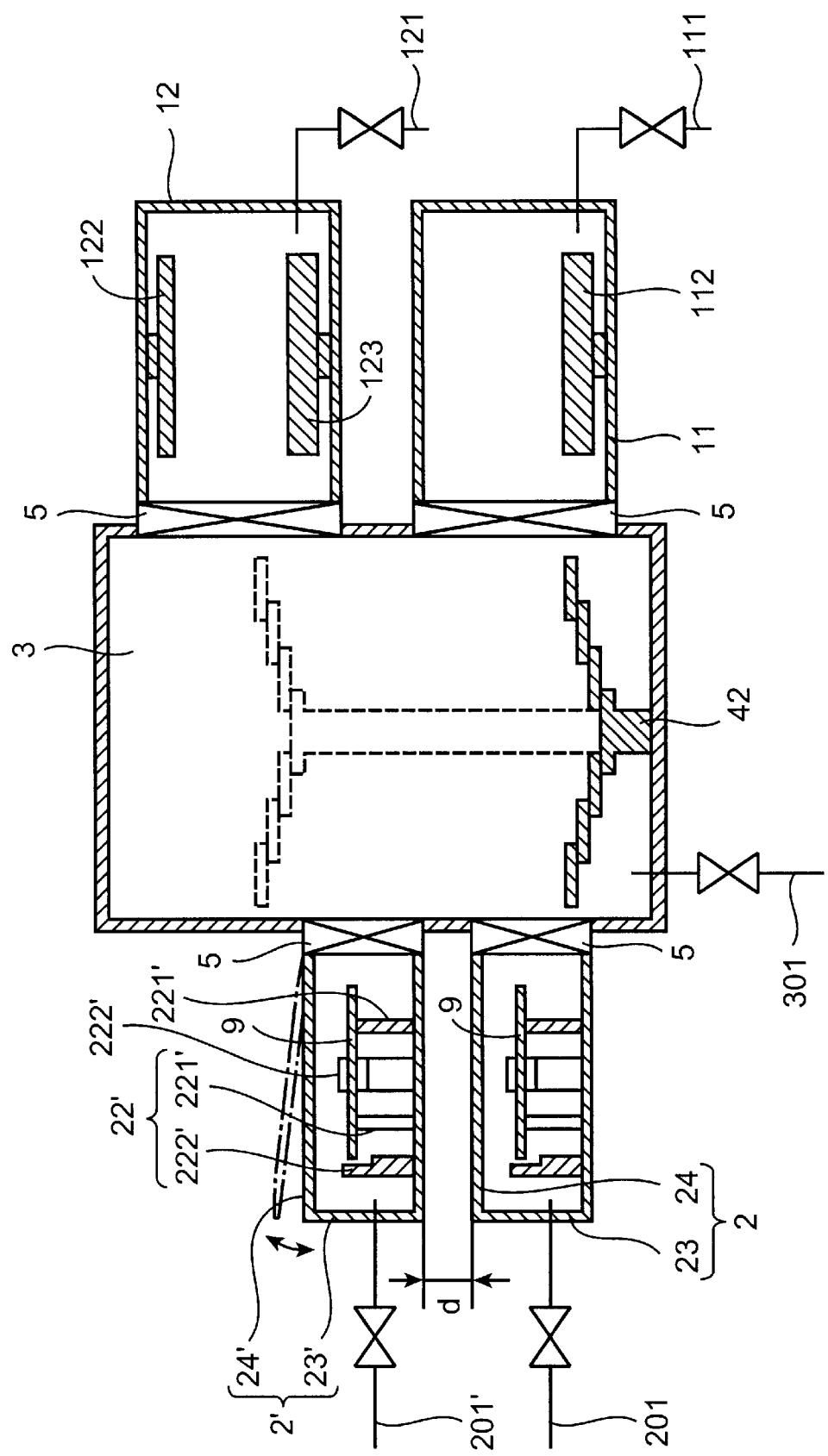
FIG. 2 is a cross-sectional view along A—A in FIG. 1.

FIG. 1 is an outline plan view of a substrate processing apparatus according to a first embodiment of the invention of the present application, and FIG. 2 is a cross-sectional view along A—A in FIG. 1.

First Embodiment

The apparatus of the present embodiment shown in FIG. 1 and FIG. 2 is equipped with a centrally provided evacuable separation chamber 3, a plurality of evacuable load lock chambers 2, 2' and evacuable process chambers 11 and 12 which are hermetically connected via gate valves 5 at the sides of separation chamber 3. A transfer mechanism 42 is provided inside separation chamber 3 and removes a substrate 9 from one of the load lock chambers 2, 2' and transfers it to each process chamber 11, 12 in a prescribed sequence after which it returns it to one of the load lock chambers 2, 2'. Each of the chambers 11, 12, 2, 2' and 3 is a hermetic vacuum enclosure equipped with dedicated vacuum pump systems 111, 121, 201, 201' and 301.

In addition, in the preferred embodiment, each of the gate valves 5 arranged between the load lock chambers 2, 2' and the separation chamber 3, and each of the gate valves 5 arranged between the process chambers 11, 12 and the separation chamber 3 may be individually controllable.

First, in the present embodiment, each load lock chamber 2, 2' is made to accommodate a single substrate 9. Specifically, each load lock chamber 2, 2' in the present embodiment has inside it a substrate holder 22, 22' which holds a single substrate 9.

Substrate holder 22, 22' includes three substrate holding pins 221, 221' and three locating blocks 222, 222' for locating the substrate 9. The three substrate holding pins 221, 221' are provided standing up from the bottom surface of load lock chamber 2, 2' in such a way that they are positioned at the vertices of an equilateral triangle. Also, in the present embodiment, it is assumed that substrate 9 is a semiconductor wafer which has a circular disk shape. The three locating blocks 222, 222' are provided so as to be positioned slightly outside the positions at the circumference of this disc-shaped substrate 9.

Meanwhile, load lock chamber 2, 2' includes a chamber main body 23, 23' and an upper covering part 24, 24' which is attached to chamber main body 23, 23' via a hinge (not illustrated), allowing it to be opened and closed. When a substrate 9 is loaded into load lock chamber 2, 2', the upper covering part 24, 24' is opened and substrate 9 is manually mounted on substrate holding pins 221, 221'. Here, it is necessary to position substrate 9 inside the three locating blocks 222, 222', whereby the aligning of substrate 9 can be performed by this mounting operation. As a result, when substrate 9 is transferred into process chambers 11 and 12 described below, substrate 9 can always be disposed at the same prescribed position inside process chambers 11 and 12. Consequently, this contributes to improving the processing reproducibility. Note that a sealing member such as an O-ring is provided between upper covering part 24 and chamber main body 23, thus assuring a hermetic seal.

As described above, the fact that load lock chamber 2, 2' is configured so as to accommodate only one substrate 9 is related to the abovementioned way in which it is located inside load lock chamber 2, 2', but this also contributes to making load lock chamber 2, 2' more compact. Specifically, the load lock chamber 2, 2' in the present embodiment preferably has a rectangular box shape with very small internal dimensions of width 320 mm×depth 320 mm×height 15 mm. Substrate 9 is assumed to be a semiconductor wafer of 300 mm diameter, and in the present embodiment the width and depth are made only about 20 mm longer than the size of substrate 9.

In a preferred embodiment, the horizontal dimensions of the load lock chambers are only 5 to 10% larger than the diameter of the substrate, preferably about 6.66% larger. However, in some situations, the dimensions may be larger, if necessary, including, but not limited to, up to 15, 20, or 25% larger. In addition, the height of the load lock chamber is also kept as small as possible, i.e., from 10–20 mm in height, preferably 15 mm. In some cases, the height may be taller, if necessary, including, but not limited to 25, 30, or 35 mm in height. The important concept is to keep the overall size of the load lock chamber as small as possible to not only take up less floor space, but to also minimize the time required to reduce the pressure therein. Thus, in a preferred embodiment, the interior volume of the load lock chamber is in the range of about 1,500 cm$^3$ to 2,000 cm$^3$, preferably about 1,536 cm$^3$.

In this way, since load lock chambers 2, 2' have a small interior space, the time required to evacuate the interior of each load lock chamber 2, 2' with vacuum pump systems 201, 201' (referred to as the pumping time in the following) is substantially less than that of conventional apparatus. The vacuum pump system 201, 201' of each load lock chamber 2, 2' uses a dry pump with a low pumping speed of 20 liters per minute or thereabouts, but even with a vacuum pump having this pumping speed, the time required to pump to a pressure of $1\times10^{-1}$ to $5\times10^{-2}$ Torr, as used in conventional apparatus, is from 180 to 240 seconds or thereabouts, which is a reduction of about $\frac{1}{10}$ to $\frac{1}{16}$ over a conventional apparatus. Note that a direct-coupled oil-sealed rotary pump or the like can be used for this sort of small scale vacuum pump, and pumps of this sort include the M20622BB produced by Anelva Co., Ltd. This use of a small scale vacuum pump has the advantage of reducing the amount of space taken up by the overall apparatus in the same way as load lock chamber 2, 2'.

Also, in the present embodiment, two of these load lock chambers 2, 2' are provided, and these two load lock chambers 2, 2' are provided stacked one on top of the other. As FIG. 1 and FIG. 2 show, separation chamber 3 has a square box shape and the two load lock chambers 2, 2' are connected to one side thereof. In this way, although the provision of two load lock chambers is aimed at improved productivity, stacking them up in this way also reduces the area they occupy. Note that in the present specification, "stacking" refers to providing two members in a vertically overlapping arrangement, but it is not necessary for them to completely overlap and it is taken to refer to an overlap of at least half as seen in plan view.

The gap d between the two load lock chambers is preferably at least 150 mm. This is so as not to impede operations such as opening the top cover part 24 of the lower load lock chamber 2 to set in place or remove a substrate 9. Considering the usual size of a human hand, a gap d of less than 150 mm would make it difficult to insert a hand-held substrate 9 into load lock chamber 2. Accordingly, a gap d of at least 150 mm is preferable.

Furthermore, each of the load lock chambers 2, 2' may be detachably mounted to the separation chamber 3 so that the load lock chambers 2, 2' may be easily detached for cleaning or other maintenance. And, each of the process chambers 11, 12 may be similarly detachably mounted to the separation chamber 3 for easy detachment for cleaning or other maintenance procedures. The mounting mechanism is preferably one that enables easy detachment and reattachment without harm to the apparatus.

Next, as shown in FIG. 1, two process chambers 11 and 12 are provided in the present embodiment. As FIG. 1 and FIG. 2 show, the two process chambers 11 and 12 are stacked up in the same way as load lock chambers 2. The two process chambers 11 and 12 are connected to the side surface of separation chamber 3 opposite the side surface on the side where load lock chambers 2 are stacked up. In this way, in the apparatus of the present embodiment, process chambers 11 and 12 are also stacked up in addition to load lock chambers 2, thereby further reducing the area occupied by the overall apparatus.

The gap between process chamber 11 and process chamber 12 is also preferably at least 150 mm as in the case of the load lock chambers 2, 2' as mentioned above. For process chambers 11 and 12, a structure is often adopted whereby internal maintenance is facilitated by opening and closing part of the upper panel, which would obviously be difficult to do with a gap of less than 150 mm.

The vacuum pump systems 111 and 121 with which process chambers 11 and 12 are equipped are preferably of a multi-stage configuration having a turbo-molecular pump and a dry pump, thereby allowing the interiors of process chambers 11 and 12 to be evacuated to an ultimate pressure of $2.2 \times 10^{-7}$ to $2.2 \times 10^{-8}$ Torr. Note that the vacuum pump system 301 that evacuates the interior of separation chamber 3 also has a similar configuration.

The configuration of the two process chambers 11 and 12 differs according to the type of substrate processing. For example, when performing film deposition processing by sputtering, one of the process chambers (e.g., the lower process chamber) 11 is configured to perform pre-heating, while the other process chamber (e.g., the upper process chamber) 12 is configured to perform sputter film deposition.

A heat stage 112 incorporating a heating mechanism is provided inside the lower process chamber (preheating chamber) 11. Heat stage 112 is a block-shaped member on whose upper surface substrate 9 is placed. Heating mechanisms one might use include a cartridge heater that generates Joule heat by electrical conduction, or an infrared lamp that performs radiative heating.

The purpose of pre-heating is mainly to perform degassing and the like of substrate 9. The temperature of substrate 9 rises sharply due to the heat and the like from the plasma formed by the sputter discharge. If sputtering is performed without preheating, the occluded gas in substrate 9 is rapidly evolved during this temperature rise. As a result, impurities such as gas bubbles can easily become mixed into the thin film as it is deposited. To avoid such problems, substrate 9 is preheated in preheating chamber 11. Preheating may be performed by heating substrate 9 to 200–250° C. or thereabouts and keeping it at this temperature for 120 to 180 seconds.

A cathode 122 and substrate holder 123 or the like is provided inside the upper process chamber (sputtering chamber) 12. Cathode 122 is a module incorporating a target which is provided so that the sputtered surface at the front is exposed to the interior of sputtering chamber 12, and a magnet, or the like, is provided behind the target. The target is a disc made of the material to be used for film deposition, and a negative high voltage or high-frequency voltage is applied to it by a sputtering power source (not illustrated).

Note that a gas introduction system (not illustrated) is provided to introduce a prescribed gas into sputtering chamber 12. The gas introduction system is made to introduce a gas with a high sputtering rate such as argon. The gas introduction system consists of a cylinder filled with the prescribed gas, and valves, flow regulators and the like which are provided in the ducts connecting the cylinder with the interior of sputtering chamber 12.

Also, substrate holder 123 is a block-shaped member which similarly holds a substrate 9 placed on its upper surface. A heating mechanism is provided as necessary inside substrate holder 123, and is configured to heat substrate 9 to the prescribed temperature during film deposition. Note that configurations are also possible in which a self-bias voltage is applied to the surface of substrate 9 through the interaction between the plasma and high frequency waves resulting from the sputtering discharge by applying a high-frequency voltage to substrate holder 123 during film deposition. The self-bias voltage may be a negative DC voltage which acts so as to extract positive ions from the plasma and implant them into substrate 9.

An articulated robot, having arms on which substrates 9 are placed and transferred, is employed as the transfer mechanism 42 provided in separation chamber 3. This articulated robot is capable of moving its arms both in the horizontal plane and in the up/down direction. Due to the vacuum atmosphere inside separation chamber 3, a robot that operates in vacuo is employed. Transfer mechanism 42 is equipped with two arms to allow two substrates 9 to be transferred simultaneously. The two arms can either move independently or in concert with each other.

The operation of the first embodiment shown in FIG. 1 and FIG. 2 is described next.

First, the upper covering part 24 of one of the load lock chambers 2 is opened and a raw substrate 9 is accommodated in load lock chamber 2 and mounted on substrate holding pins 221. Here, the aligning of substrate 9 is simultaneously accomplished by locating block 222. Also, a raw substrate 9 is similarly set and located in the other load lock chamber 2'. Vacuum pump systems 201, 201' are then operated to evacuate the interior of load lock chambers 2, 2' down to the prescribed pressure.

Next, the gate valve 5 between the one of the load lock chambers 2 and separation chamber 3 is opened, and a substrate 9 is removed from the one load lock chamber 2 by transfer mechanism 42. The gate valve 5 between the one load lock chamber 2 and separation chamber 3 is then closed again, after which the gate valve 5 between separation chamber 3 and preheating chamber 11 is opened and transfer mechanism 42 transfers substrate 9 into preheating chamber 11. The gate valve 5 between separation chamber 3 and preheating chamber 11 is then closed again.

The transferred substrate 9 is placed on heat stage 112. Heat stage 112 is heated to a predetermined temperature with a heating mechanism, and substrate 9 is preheated to the prescribed temperature by being placed on heat stage 112.

After preheating has been performed for a prescribed time, the gate valve 5 between separation chamber 3 and preheating chamber 11 is opened and transfer mechanism 42 removes substrate 9 from preheating chamber 11. The gate valve 5 between separation chamber 3 and sputtering chamber 12 is then opened, and substrate 9 is transferred by transfer mechanism 42 into sputtering chamber 12. Also, in parallel with this, transfer mechanism 42 transports the substrate 9 inside the other load lock chamber 2' into preheating chamber 11.

The substrate 9 transferred into sputtering chamber 12 is mounted on substrate holder 123 and, if necessary, is heated by a heating mechanism inside substrate holder 123. In this state, the gas introduction system (not illustrated) operates to introduce a prescribed gas into sputter chamber 12 and sputtering is performed by operating a sputtering power source (not illustrated). As a result, a prescribed thin film is deposited on the surface of substrate 9. Also, in preheating chamber 11, preheating of the next substrate 9 is performed in the same way.

As the thin film deposited on substrate 9 inside sputtering chamber 12 reaches the required thickness, the sputtering power source and gas introduction system are stopped and vacuum pump system 121 evacuates the interior of sputtering chamber 12 again. Gate valve 5 is then opened and transfer mechanism 42 removes substrate 9 from sputtering chamber 12. The gate valve 5 between separation chamber 3 and the one load lock chamber 2 is then opened, and substrate 9 is transferred into the one load lock chamber 2. Substrate 9 is mounted on substrate holder 22 by the operation of rising/falling pins 221.

In parallel with this, the gate valve 5 between preheating chamber 11 and separation chamber 3 is opened, and transfer mechanism 42 removes the next substrate 9 inside preheating chamber 11 from preheating chamber 11. The gate valve 5 between sputtering chamber 12 and separation chamber 3 is then opened, and the next substrate 9 is transferred into sputtering chamber 12.

The next substrate 9 is then subjected to the same film deposition process inside sputtering chamber 12. During this period, a vent valve (not illustrated) in the one load lock chamber 2 is opened to return its interior to atmospheric pressure. Upper covering part 24 is then opened, and the processed substrate 9 is removed from the one load lock chamber 2. The next raw substrate 9 is then set and located in the one load lock chamber 2 in the same way. This substrate 9 is transferred into preheating chamber 11 in the same way by transfer mechanism 42, and is preheated.

After that, on completion of the film deposition process in sputtering chamber 12, transfer mechanism 42 transports this substrate 9 into the other load lock chamber 21. The other load lock chamber 2' is then returned to atmospheric pressure in the same way, and the processed substrate 9 is removed from the other load lock chamber 2'. The next raw substrate 9 is then accommodated and located in the other load lock chamber 2' in the same way. In this way, the substrates 9 are subjected to preheating and film deposition processing while sequentially setting substrates 9 in the two load lock chambers 2, 2' and removing substrates 9 from the two load lock chambers 2, 2'.

In the apparatus of the present embodiment relating to the abovementioned configuration and operation, since substrates 9 can be located in each load lock chamber 2, 2' the area taken up by the apparatus is reduced because the load lock chambers 2, 2' and process chambers 11 and 12 are stacked one on top of the other. And since each load lock chamber 2, 2' accommodates only one substrate 9 and each load lock chamber 2, 2' can be made sufficiently small-scale, the number of times they are evacuated from atmospheric pressure to the prescribed vacuum pressure increases, but the time required to evacuate them once is made substantially shorter. As a result, the overall time required for evacuation of load lock chambers 2, 2' is reduced. Consequently, the productivity of the apparatus increases.

Second Embodiment

Figure 3:
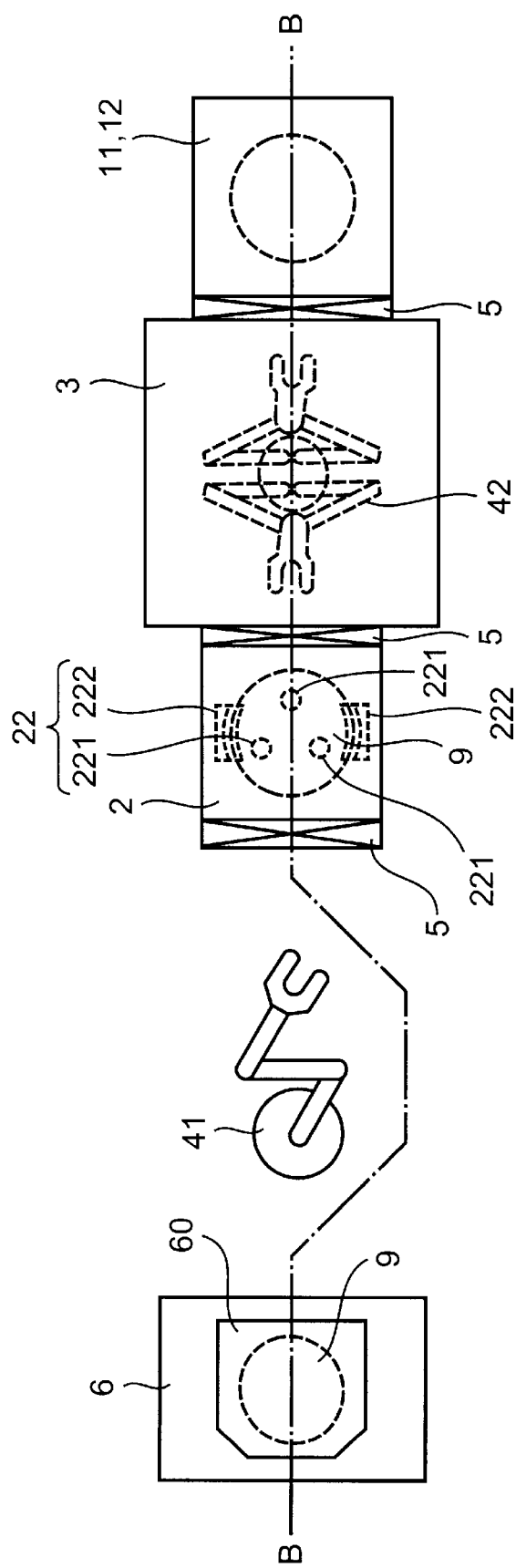
FIG. 3 is a plan view of a substrate processing apparatus according to a second embodiment of the invention of the present application.
Figure 4:
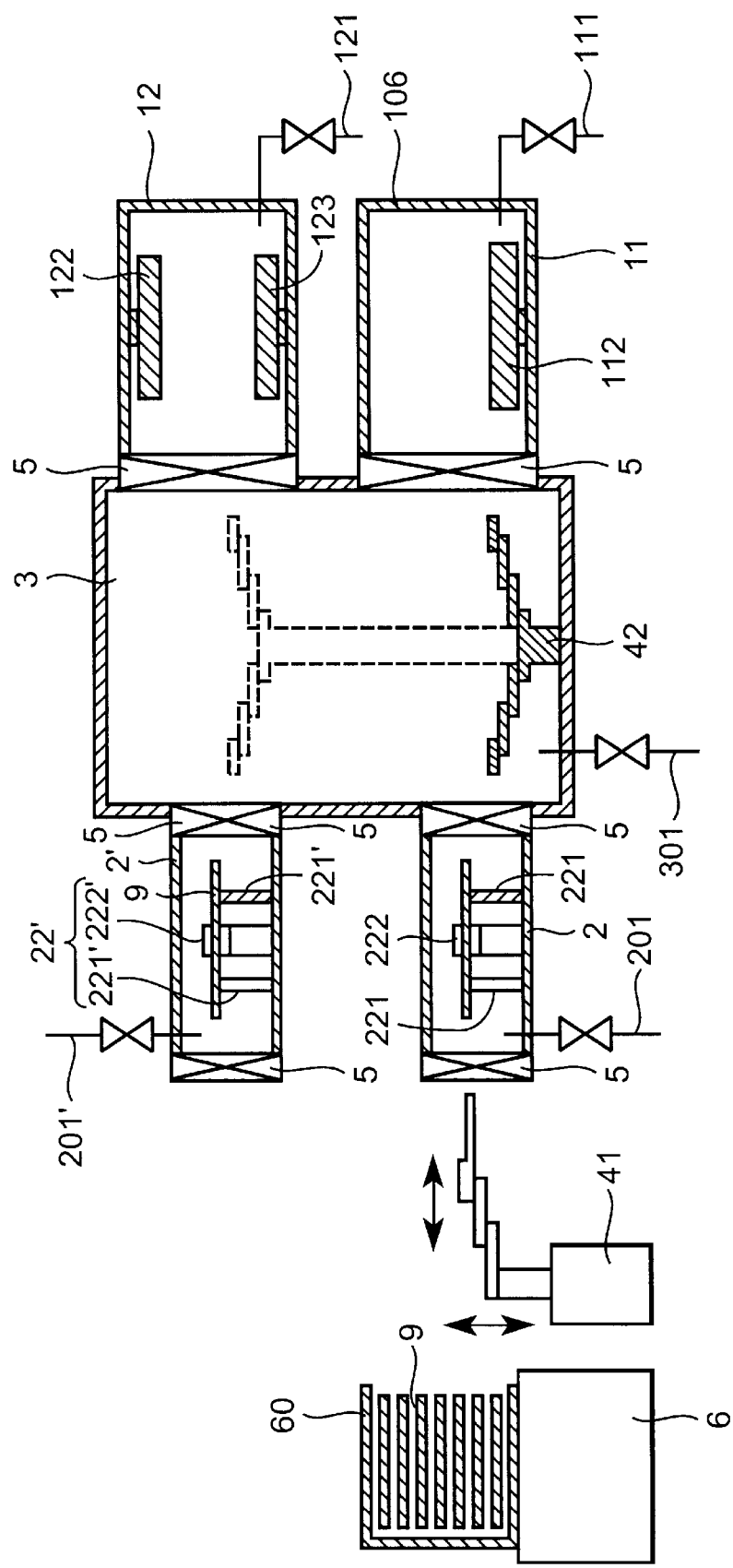
FIG. 4 is a cross-sectional view along B—B in FIG. 3.

Next, a second embodiment of the invention of the present application is described. FIG. 3 is an outline plan view of a substrate processing apparatus according to a second embodiment of the present invention, and FIG. 4 is a cross-sectional view along B—B in FIG. 3. The apparatus of the present embodiment shown in FIG. 3 and FIG. 4 differs only in terms of the configuration for setting substrates 9 in load lock chambers 2, 2' and for removing substrates 9 from load lock chambers 2, 2' and the rest of the configuration is more or less the same as that of the first embodiment.

Accordingly, reference numbers in FIGS. 3 and 4 that are the same as reference numbers in FIGS. 1 and 2 refer to elements that are the same as the elements in FIGS. 1 and 2. Of course, the figures illustrate only preferred embodiments, and actual configurations of the present invention may be different than those illustrated herein.

First, a loading station 6 in which is disposed an external cassette 60 is provided on the atmospheric side outside load lock chambers 2, 2'. The purpose of loading station 6 is to hold an external cassette 60, which accommodates a prescribed number of substrates 9, at a prescribed position. An auto-loader 41, which automatically transfers substrates 9, is also provided between external cassette 60 and each load lock chamber 2.

Auto-loader 41, like transfer mechanism 42, is configured from an articulated robot equipped with an arm, and is able to move the arm both in the horizontal plane and in the vertical direction. The shape of the arm is made such that it does not interfere with the three substrate holding pins 221, 221' inside load lock chambers 2, 2'. Specifically, it is made so that an arm on which a substrate 9 is placed is introduced into load lock chamber 2, 2' and lowered by a prescribed distance, whereupon the substrate 9 is placed on the substrate holding pins 221, 221'. The removal of substrate 9 is performed by reversing these operations.

Also, associated with the provision of the auto-loader 41, a gate valve 5 is also provided at the interface between the atmosphere and each load lock chamber 2, 2' (the opposite side wall part to the side where separation chamber 3 is provided), as shown in FIG. 3 and FIG. 4. Also, there are only two locating blocks 222, 222' in the present embodiment due to the way in which this gate valve 5 is opened and substrate 9 is removed. The locating blocks 222, 222' face each other across a gap slightly larger than the width of a substrate 9. The mutually facing sides of the two locating blocks 222, 222' have cylindrical surfaces with the same curvature as the outer perimeter of substrate 9. When substrate 9 is placed on the three substrate holding pins 221, 221' the aligning of substrate 9 is thereby achieved by positioning the perimeter of substrate 9 along these mutually facing sides.

The action of this second embodiment is the same as that of the abovementioned first embodiment except that auto-loader 41 performs the insertion and removal of substrates 9 automatically. Auto-loader 41 removes raw substrates 9 one at a time from external cassette 60, transfers them into each load lock chamber 2, 2' and mounts them on substrate holding pins 221, 221'. Also, it removes processed substrates 9 from load lock chambers 2, 2' and returns them to the original locations of these substrates 9 in external cassette 60. When all the substrates 9 that were in external cassette 60 have been processed and returned to their original locations, the processing on one external cassette 60 is completed. The operator replaces it with another external cassette 60 accommodating raw substrates 9.

In this embodiment, since substrates 9 can be located in each load lock chamber 2, 2', the area taken up by the overall apparatus decreases because load lock chambers 2, 2' and process chambers 11 and 12 are stacked on top of each other. Also, since each load lock chamber 2, 2' only accommodates a single substrate 9 and each load lock chamber can be made adequately small-scale, the overall time required for evacuation of load lock chambers 2, 2' decreases and the productivity of the apparatus increases.

Third Embodiment

Figure 5:
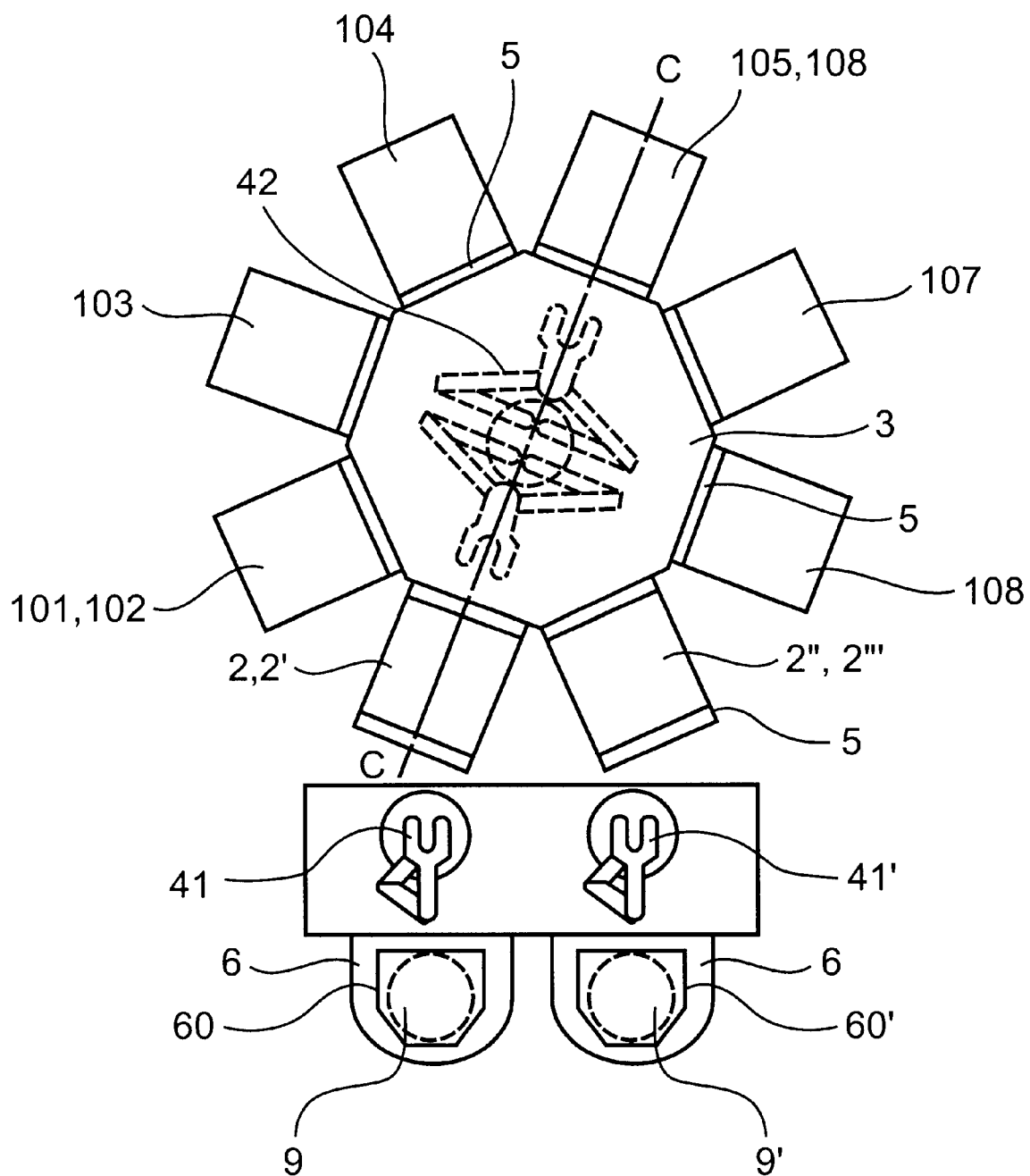
FIG. 5 is a plan view of a substrate processing apparatus according to a third embodiment of the invention of the present application.
Figure 6:
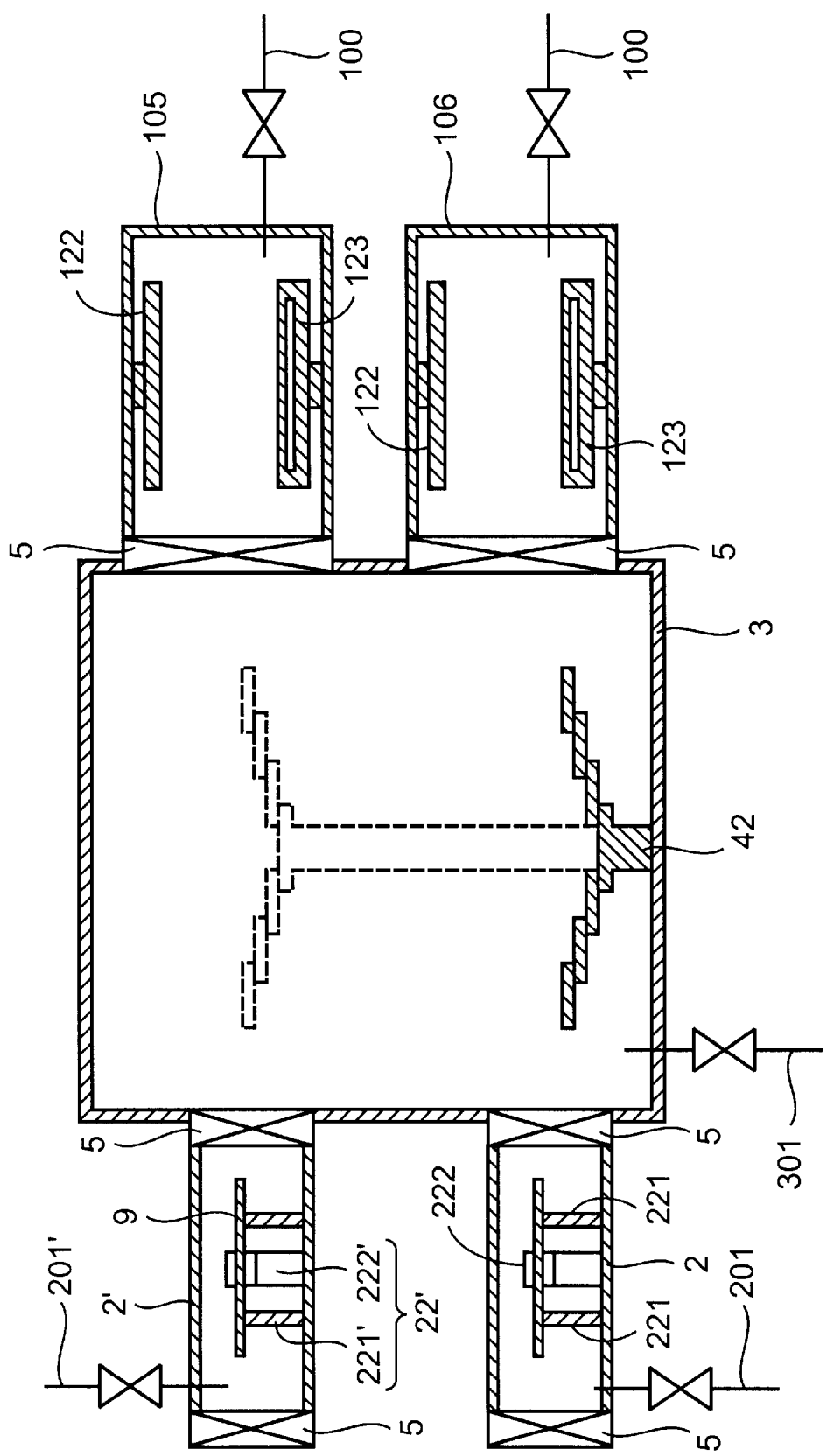
FIG. 6 is a cross-sectional view along C—C in FIG. 5.
Figure 7:
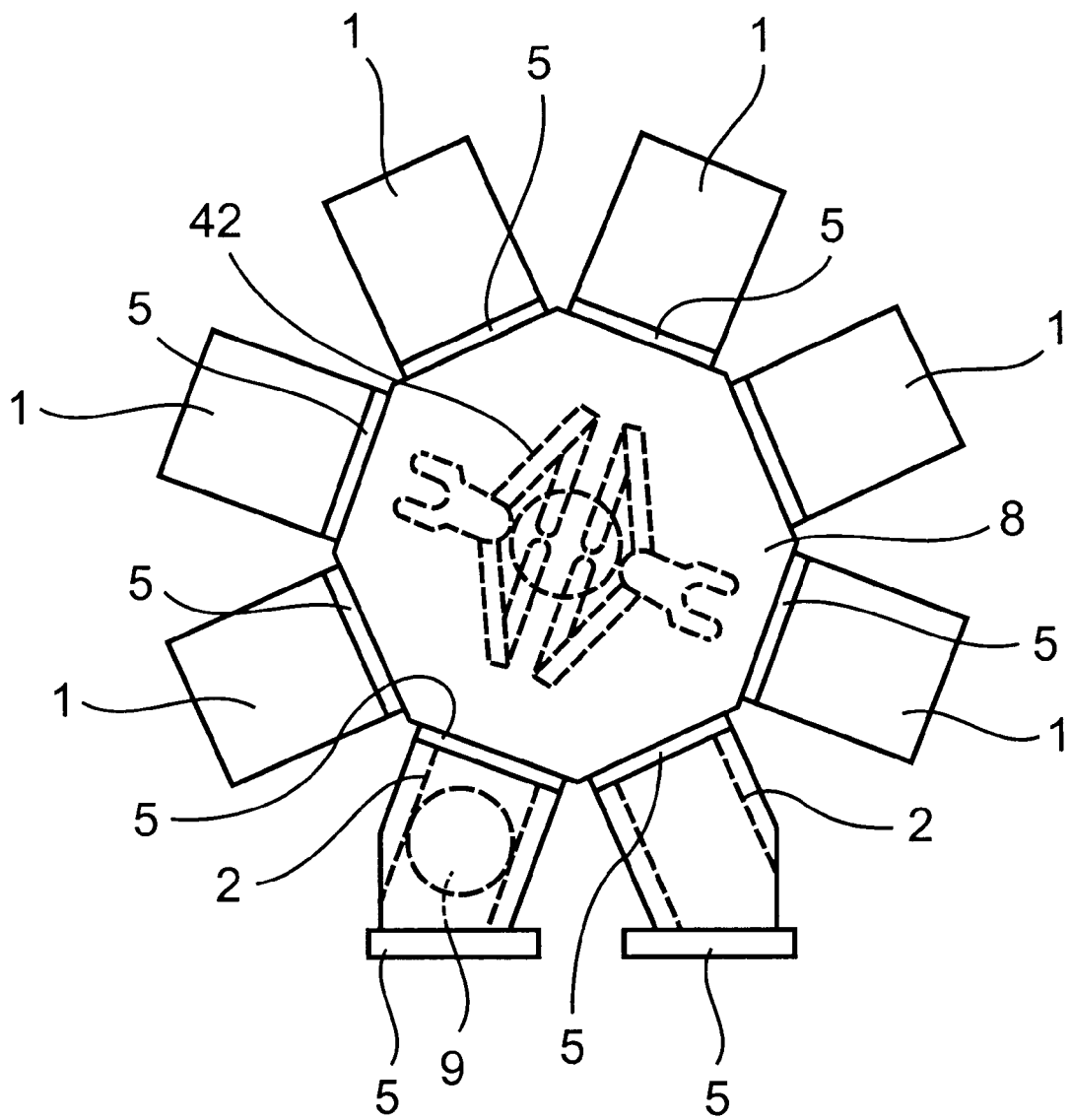
FIG. 7 is a plan view of a cluster tool type substrate processing apparatus as one example of a conventional substrate processing apparatus.

A third embodiment of the invention of the present application is described next. FIG. 5 is an outline plan view showing the configuration of a third embodiment of a substrate processing apparatus according to the invention of the present application, and FIG. 6 is an outline cross-sectional view along C—C in FIG. 5. The reference numbers in FIGS. 5 and 6 that are the same as reference numbers in FIGS. 1–4 refer to elements that are the same as the elements in FIGS. 1–4. Of course, the figures illustrate only preferred embodiments, and actual configuration of the present invention may be different than those illustrated herein.

The third embodiment of a substrate processing apparatus shown in FIG. 5 and FIG. 6 has a chamber layout comprising a centrally provided separation chamber 3, a plurality of process chambers 101, 102, 103, 104, 105, 106, 107 and 108 provided around separation chamber 3, and a plurality of load lock chambers 2, 2', 2'', 2'''. Separation chamber 3 has an octagonal shape, and the process chambers 101, 102, 103, 104, 105, 106, 107 and 108 and load lock chambers 2, 2', 2'', 2''' are connected to the sides thereof. The separation chamber 3, process chambers 101, 102, 103, 104, 105, 106, 107 and 108 and load lock chambers 2, 2', 2'', 2''' are hermetically connected via gate valves 5.

In this third embodiment, each load lock chamber 2, 2', 2'', 2''' is configured so as to accommodate only a single substrate 9, and as before it has a very small interior space measuring 320 mm wide×320 mm deep×15 mm high. Each load lock chamber 2, 2', 2'', 2''' has a dedicated vacuum pump system 201, 201' and this vacuum pump system 201, 201' is configured so as to evacuate with a small-scale pump in the same way as mentioned above. Also, each load lock chamber 2, 2', 2'', 2''' has a substrate holder 22, 22' comprising substrate holding pins 221, 221' and locating blocks 222, 222' in the same way as shown in FIG. 3 and FIG. 4.

Also, as FIG. 5 and FIG. 6 show, four load lock chambers 2, 2', 2'', 2''' are provided in this third embodiment. Load lock chamber 2' is above load lock chamber 2, and load lock chamber 2''' is above load lock chamber 2''. Each of the load lock chambers is also stacked up in this embodiment. Specifically, two load lock chambers 2', 2''' are provided stacked up at each of two adjoining faces of separation chamber 3.

In this third embodiment, as shown in FIG. 5, two auto-loaders 41 are provided. Corresponding to these, two external cassettes 60 are disposed in loading station 6. In FIG. 5, the auto-loader 41 on the left side transfers substrates 9 between the external cassette 60 disposed on the left side and the two load lock chambers 2, 2' stacked on the left side, while the auto-loader 41' on the right side transfers substrates 9 between the external cassette 60' disposed on the right side and the two load lock chambers 2'', 2''' stacked on the right side.

A transport mechanism 42 which transports substrates 9 between chambers is provided in separation chamber 3. This transfer mechanism 42 is also an articulated robot equipped with an arm on which a substrate is placed as in the first embodiment, and is able to transfer a substrate 9 to any position in the horizontal plane and any position in the perpendicular direction within its operating range. As a transfer mechanism of this sort, one might use, for example, an RR468 made by Rorze Corporation.

Note that the vacuum pump system 301 that evacuates separation chamber 3 and the vacuum pump systems 100 that evacuate each of the process chambers 101, 102, 103, 104, 105, 106, 107 and 108 are similar to the vacuum pump systems 111, 121 and 301 in the first embodiment, and it is possible to employ a combination of turbo-molecular pumps and dry pumps. Note that exhaust system 301 and vacuum pump system 100 are each provided as dedicated exhaust systems for each of the chambers 3, 101, 102, 103, 104, 105, 106, 107 and 108. These vacuum pump systems 301 and 100 may all have the same configuration, or they may have different configurations according to the size and required pumping speed of each of the chambers 3, 101, 102, 103, 104, 105, 106, 107 and 108.

Also, in this third embodiment, although the process chambers 101, 102, 103, 104, 105, 106, 107 and 108 are connected to six sides of the octagonal box shaped separation chamber 3, they are stacked up at two of these sides as shown in FIG. 5 and FIG. 6. Accordingly, in the present embodiment, eight process chambers 101, 102, 103, 104, 105, 106, 107 and 108 are provided. If the eight process chambers 101, 102, 103, 104, 105, 106, 107 and 108 are referred to as first process chamber 101, second process chamber 102, . . . eighth process chamber 108, then first and second process chambers 101 and 102 and fifth and sixth process chambers 105 and 106 are stacked up.

The configuration of each of the process chambers 101, 102, 103, 104, 105, 106, 107 and 108 differs according to the type of substrate processing, but an example is described here in which the apparatus of the present embodiment is used to perform a contact interconnection process. A contact interconnection process is a technique for applying interconnections and the like to the channel parts of FETs (field effect transistors). This process achieves conduction between the interconnections and buried channels by filling an interconnection material into contact holes provided by forming holes in an insulating film. The filling with interconnection material is performed by sputtering a metallic material such as aluminum. Here, hot reflow sputtering is performed by heating substrate 9, causing a thin film that has been deposited or is in the process of being deposited to reflow and fill the contact holes by flowing into them.

When the apparatus shown in FIG. 5 and FIG. 6 is an apparatus that performs a contact interconnection process, the first and second process chambers 101 and 102 are configured to perform preheating of substrates 9. Third process chamber 103 is configured to perform pre-process etching on substrates 9, and fourth process chamber 104 is configured to deposit a foundation film. Fifth and sixth process chambers 105 and 106 are configured to perform hot reflow sputtering, and seventh process chamber 107 is configured to perform cooling of substrate 9. Eighth process chamber 108 is configured to deposit a surface film.

The first and second process chambers 101 and 102 which perform preheating are configured more or less the same way as preheating chamber 11 in the first embodiment mentioned above. In this case, the first and second process chambers 101 and 102 are similarly configured to heat substrate 9 to 450–500° C. or thereabouts, and a substrate 9 can be preheated in either of the first or second process chambers 101 and 102.

The third process chamber 103 which performs pre-process etching is configured by equipping it with parts such as a substrate stage (not illustrated) on which a substrate 9 is placed and held, a gas supply system (not illustrated) which supplies a prescribed process gas to the interior, and a high-frequency power supply (not illustrated) which applies a high-frequency voltage to the substrate stage. Pre-process etching is a process to remove the native oxide film or protective film from the surface of substrate 9. The surface of a substrate 9 often has an oxide film formed by natural oxidation, and protective films are often formed. If sputtering is performed with this native oxide film or protective film left intact, the electrical characteristics of the deposited thin film can be impaired. Therefore, substrate 9 is subjected to pre-process etching to remove the native oxide film or protective film from the surface.

Specifically, argon gas is supplied as the process gas by the gas supply system, and a high-frequency electrical field is formed via the substrate stage. As a result, a high-frequency discharge is produced in the process gas, thereby forming a plasma. The surface of the substrate stage is a dielectric, and a self-bias voltage is produced at the surface of substrate 9 by the interaction between the plasma and the high frequency. This self-bias voltage is a negative DC voltage as mentioned above, and this voltage causes the positive ions in the plasma to impinge on substrate 9, and the surface of substrate 9 is thereby subjected to sputter etching by these incident ions. In this way, the native oxide film or protective film at the surface of substrate 9 is removed.

The foundation film deposited in fourth process chamber 104 is deposited as a barrier film for preventing interdiffusion between the contact interconnection material and the material of the underlying channel. The foundation film is a titanium thin film in the present embodiment, and is deposited by sputtering. Fourth process chamber 104 has more or less the same configuration as sputtering chamber 12 in the first embodiment. It differs in that the target constituting cathode 122 is made of titanium.

Also, fifth and sixth process chambers 105 and 106, which perform hot reflow sputtering, have more or less the same configuration as sputtering chamber 12 in the first embodiment. They differ in that aluminum, or the like, is used as the target constituting cathode 122. Also, a heating mechanism is provided inside substrate holder 123, and substrate 9 can thereby be heated to a temperature of 350–500° C. Fifth and sixth process chambers 105 and 106 are configured identically, and the hot reflow sputtering of substrate 9 is performed in either of the process chambers 105 and 106.

Furthermore, seventh process chamber 107 which performs cooling can sometimes be configured so that substrate 9 cools naturally, but is normally configured so that substrate 9 is placed on a cooling stage and substrate 9 is forcibly cooled. The cooling stage is a block shaped member similar to substrate holding stage 21 or the like, and is configured so that a coolant at a prescribed low temperature flows through its interior. As a result of placing it on this cooling stage, substrate 9 is cooled to a temperature between room temperature and 100° C. or thereabouts.

There are various types of surface films that can be deposited in eighth process chamber 108 and there is also a variety of ways in which they can be deposited, but the present embodiment adopts a configuration for depositing a titanium nitride thin film as an antireflective film. A substrate 9 on which a contact interconnection film has been deposited by apparatus according to the present embodiment is subjected to photolithography, i.e., exposure of a circuit pattern, in the following stage. Here, there is a problem in that it is difficult to achieve precise alignment of substrate 9 if the surface of substrate 9 is strongly reflective. Consequently, an antireflective film is deposited on the surface of substrate 9 at the previous stage.

The configuration of eighth process chamber 108 is more or less the same as the configuration of sputtering chamber 12 in the first embodiment. It differs in that titanium is used for the target constituting cathode 122. Also, the gas introduction system is configured so as to introduce argon and nitrogen as the process gas. When sputtering is performed while introducing argon and nitrogen, the film deposition is supplemented by the reaction between titanium and nitrogen, whereby a titanium nitride thin film is deposited on the surface of substrate 9. This titanium nitride thin film functions as an antireflective film. Note that the temperature of substrate 9 during this film deposition is much lower than the temperature during hot reflow sputtering, and is for example about 100° C. Accordingly, the forced cooling of substrate 9 in seventh process chamber 107 facilitates the creation of the antireflective film.

The operation of the third embodiment is described in the following.

First, the left and right auto-loaders 41, 41' operate to transfer raw substrates 9 from their respective external cassettes 60, 60' into load lock chambers 2, 2', 2", 2'''. The auto-loader 41 on the left side transports substrates 9 one at a time into the two load lock chambers 2, 2' stacked up on the left side, and the auto-loader 41' on the right side transfers substrates 9 one at a time into the two load lock chambers 2", 2''' stacked up on the right side. The substrates 9 are then located by placing them on substrate holding pins 221, 221'.

The transfer mechanism 42 inside separation chamber 3 removes substrates 9 from the four load lock chambers 2, 2', 2", 2''' in a prescribed sequence and sends them to each of the process chambers 101, 102, 103, 104, 105, 106, 107 and 108. An example of such a sequence is upper left load lock chamber 2', lower left load lock chamber 2, upper right load lock chamber 2''', and lower right load lock chamber 2". The first substrate 9 is sent to first process chamber 101 and is heated to a prescribed temperature. The next substrate 9 is then sent to second process chamber 102 and similarly heated to a prescribed temperature.

After that, the first substrate 9 in first process chamber 101 is sent to third process chamber 103 and subjected to pre-process etching. The next substrate 9 is kept back inside second process chamber 102. Another substrate 9 is then sent to the newly vacated first process chamber 101.

After that, the first substrate 9 is sent to fourth process chamber 104 where a foundation film is deposited, the substrate 9 kept back in second process chamber 102 is sent to third process chamber 103, and a fourth substrate 9 is sent to second process chamber 102. As a result, a state is reached in which the substrates 9 that were in the four load lock chambers have all been sent out for processing. The left and right auto-loaders 41, 41' operate again to transfer raw substrates into the newly vacated load lock chambers 2, 2', 2", 2''' so that each of the four load lock chambers accommodates a single substrate 9.

The first substrate 9 is sent from fourth process chamber 104 to fifth or sixth process chamber 105 or 106 and is subjected to hot reflow sputtering. This substrate 9 is then cooled in seventh process chamber 107, after which a foundation film is deposited in eighth process chamber 108. At the same time, other substrates 9 are being subjected to the previous processes in the previous process chambers 101, 102, 103, 104, 105 or 106, and 107.

When the first substrate 9 is being processed in eighth process chamber 108, a state is reached where a substrate 9 is being processed in each of the first through eighth process chambers 101, 102, 103, 104, 105, 106, 107 and 108, and in which substrates 9 have been transported in via the four load lock chambers 2, 2', 2", 2''' on two occasions. In this way, each part can be controlled in an orderly fashion if the number of process chambers is divisible by the number of load lock chambers, which is preferable.

After that, the first substrate 9 is returned from eighth process chamber 108 back to the upper left load lock chamber 2' by transfer mechanism 42. This substrate 9 is then returned from load lock chamber 2' to its original position in the external cassette 60 on the atmospheric side by auto-loader 41. Auto-loader 41 operates straight away to load the next substrate 9 into its upper left load lock chamber 2'.

In this way, the substrates 9 are sent one at a time via any of the four load lock chambers 2, 2', 2", 2''' for processing in each of the process chambers 101, 102, 103, 104, 105, 106, 107 and 108, and are then returned to the external cassette 60 via the original load lock chamber. By repeating this process, all the substrates 9 in the two external cassettes 60 are processed in turn and returned to their original positions in external cassettes 60.

In this third embodiment, it is not only possible to locate substrates 9 in each load lock chamber, but since the load lock chambers 2, 2', 2", 2''' and process chambers 101, 102, 105 and 106 are stacked up, the area taken up by the overall apparatus becomes smaller. Also, since each load lock chamber 2, 2', 2", 2''' accommodates just a single substrate 9 and each load lock chamber 2, 2', 2", 2''' is made sufficiently small-scale, the overall time required to evacuate load lock chambers 2, 2', 2", 2''' is reduced and the productivity of the apparatus increases.

In the apparatus of each of the embodiments mentioned above, configurations are adopted in which there are a plurality of pairs of load lock chambers and process chambers which are stacked up in at least one place, although configurations in which a plurality of only one of these types of chamber are stacked up are also possible. This is because it is also possible to reduce the area of the overall apparatus in such cases.

Also, it goes without saying that the chambers can also be stacked up in three or more places.

Moreover, although dedicated evacuation systems were used to evacuate each chamber, it is also possible to use a shared vacuum pump system. For example, in the third embodiment, a configuration can be adopted wherein of the vacuum pump systems 100 that evacuate each of the process chambers 101, 102, 103, 104, 105, 106, 107 and 108, the turbo-molecular pumps provided at the front stage can be provided as individual dedicated pumps for each process chamber 101, 102, 103, 104, 105, 106, 107 and 108, while the dry pumps provided at the rear stage can be combined into a single shared pump.

In each of the embodiments described herein, the gate valves separating the various chambers may all be individually controllable as described above with regard to the first embodiment. And, each of the load lock chambers and the process chambers may be detachably mounted to the separation chamber, as also described above with regard to the first embodiment.

In addition to the abovementioned film deposition by sputtering, other examples of substrate processes one might mention include chemical vapor deposition (CVD)—wherein reactive gases are introduced and a film is deposited by means of a vapor-phase reaction—and dry etching.

As described above, with the present invention, since the load lock chambers and/or process chambers are stacked up, the area taken up by the overall apparatus does not increase even if the number of load lock chambers and/or process chambers increases.

Also, since substrates can be located inside the load lock chambers, it is always possible to dispose the substrates at the prescribed position inside the process chambers, thereby contributing to improved reproducibility of the process.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A substrate processing apparatus, comprising:
   a centrally provided evacuable separation chamber having sides,
   a plurality of evacuable load lock chambers which are hermetically connected to the sides of the separation chamber via gate valves,
   a plurality of evacuable process chambers which are hermetically connected to the sides of the separation chamber via gate valves, and
   a transfer mechanism provided inside the separation chamber, the transfer mechanism removes a substrate from one of the load lock chambers, transfers it to one or more of the process chambers in a prescribed sequence, and then returns it to one of the load lock chambers,
   the load lock chambers are stacked up in at least one place around the periphery of said separation chamber, and
   each of the load lock chambers incorporates a substrate holder and holds only a single substrate.

2. The apparatus of claim 1, further comprising means for individually controlling at least some of the gate valves.

3. The apparatus of claim 2, wherein the control means individually controls the gate valves connecting the load lock chambers to the separation chamber.

4. The apparatus of claim 2, wherein the control means individually controls all of the gate valves.

5. The apparatus of claim 1, wherein at least one of the load lock chambers are replaceably detachable from the separation chamber.

6. The apparatus of claim 1, wherein all of the load lock chambers are replaceably detachable from the separation chamber.

7. The apparatus of claim 2, wherein at least one of the load lock chambers are replaceably detachable from the separation chamber.

8. The apparatus of claim 4, wherein all of the load lock chambers are replaceably detachable from the separation chamber.

9. The apparatus of claim 8, wherein all of the process chambers are replaceably detachable from the separation chamber.

10. The apparatus of claim 1, wherein each of the load lock chambers are less than or equal to 15 mm in height.

11. The apparatus of claim 1, wherein each of the load lock chambers has an interior volume of less than or equal to 2,000 $cm^3$.

12. The apparatus of claim 5, wherein each of the load lock chambers has an interior volume of less than or equal to 2,000 $cm^3$.

13. The apparatus of claim 10, wherein each of the load lock chambers has an interior volume of less than or equal to 2,000 $cm^3$.

14. The apparatus of claim 1, wherein each of the load lock chambers has an interior volume of less than or equal to about 1,536 $cm^3$.

15. The apparatus of claim 10, wherein each of the load lock chambers has an interior volume of less than or equal to about 1,536 $cm^3$.

16. A substrate processing apparatus, comprising:

a centrally provided evacuable separation chamber having sides, a plurality of evacuable load lock chambers which are hermetically connected to the sides of the separation chamber via gate valves, a plurality of evacuable process chambers which are hermetically connected to the sides of the separation chamber via gate valves, a transfer mechanism provided inside the separation chamber, the transfer mechanism removes a substrate from one of the load lock chambers, transfers it to one or more of the process chambers in a prescribed sequence, and then returns it to one of the load lock chambers, the load lock chambers are stacked up in at least one place around the periphery of said separation chamber, each of the load lock chambers includes a dedicated vacuum pump system, and each of the load lock chambers incorporates a substrate holder and holds only a single substrate.

17. The apparatus of claim 16, further comprising a dedicated vacuum pump system for each of the process chambers.

18. A substrate processing apparatus, comprising:

a centrally provided evacuable separation chamber having sides, a plurality of evacuable load lock chambers which are hermetically connected to the sides of the separation chamber via gate valves, a plurality of evacuable process chambers which are hermetically connected to the sides of the separation chamber via gate valves, wherein each of the gate valves is independently controllable, a transfer mechanism provided inside the separation chamber, the transfer mechanism removes a substrate from one of the load lock chambers, transfers it to one or more of the process chambers in a prescribed sequence, and then returns it to one of the load lock chambers, the load lock chambers are stacked up in at least one place around the periphery of said separation chamber, each of the load lock chambers includes a dedicated vacuum pump system, and each of the load lock chambers incorporates a substrate holder and holds only a single substrate.

19. The apparatus of claim 18, further comprising a dedicated vacuum pump system for each of the process chambers.

\* \* \* \* \*